(12) United States Patent
Chatterjee et al.

(10) Patent No.: US 7,663,415 B2
(45) Date of Patent: Feb. 16, 2010

(54) PHASE LOCKED LOOP (PLL) METHOD AND ARCHITECTURE

(75) Inventors: Kallol Chatterjee, Kolkata (IN); Nitin Agarwal, Noida (IN)

(73) Assignee: STMicroelectronics PVT. Ltd., Greater Noida, Uttar Pradesh (IN)

( * ) Notice: Subject to any disclaimer, the term of this patent is extended or adjusted under 35 U.S.C. 154(b) by 0 days.

(21) Appl. No.: 11/649,747

(22) Filed: Jan. 3, 2007

(65) Prior Publication Data
US 2008/0018369 A1  Jan. 24, 2008

(30) Foreign Application Priority Data
Dec. 30, 2005  (IN)  ................ 3551/DEL/2005

(51) Int. Cl.
*H03L 7/06* (2006.01)
(52) U.S. Cl. ............ 327/156; 327/147; 327/148; 327/155; 327/157; 375/371; 375/372; 375/373; 375/374; 375/375; 375/376; 331/17
(58) Field of Classification Search ............ 327/156
See application file for complete search history.

(56) References Cited
U.S. PATENT DOCUMENTS

| | | | |
|---|---|---|---|
| 4,864,253 A * | 9/1989 | Zwack | ............ 331/1 A |
| 5,896,068 A | 4/1999 | Moyal | |
| 6,895,525 B1 * | 5/2005 | Wilkie et al. | ............ 713/503 |
| 7,180,377 B1 * | 2/2007 | Leong et al. | ............ 331/17 |
| 2002/0196060 A1 * | 12/2002 | Ichimaru | ............ 327/156 |
| 2005/0226357 A1 * | 10/2005 | Yoshimura | ............ 375/376 |

\* cited by examiner

*Primary Examiner*—Lincoln Donovan
*Assistant Examiner*—John W Poos
(74) *Attorney, Agent, or Firm*—Lisa K. Jorgensen; Paul F. Rusyn; Graybeal Jackson LLP

(57) ABSTRACT

A phase locked loop (PLL) architecture provides voltage controlled oscillator (VCO) gain compensation across process and temperature. A simulator may be used to calculate the control voltages for the maximum and minimum output frequency of the VCO for each combination of the process and temperature corners. The maximum and minimum values of control voltage are then selected from these control voltages. Using a counter, the number of cycles of VCO in some cycles of the PLL input clock are counted in binary form and stored in latches for the extreme control voltages. The difference between them and the corresponding difference for typical process and temperature corner is used to modify the charge pump to change the current delivered to the loop filter. After the charge pump bits have been decided, the input control voltage of the VCO connects to the charge pump output to start the normal operation of the PLL.

20 Claims, 4 Drawing Sheets

PLL WITH COMPENSATION BLOCK

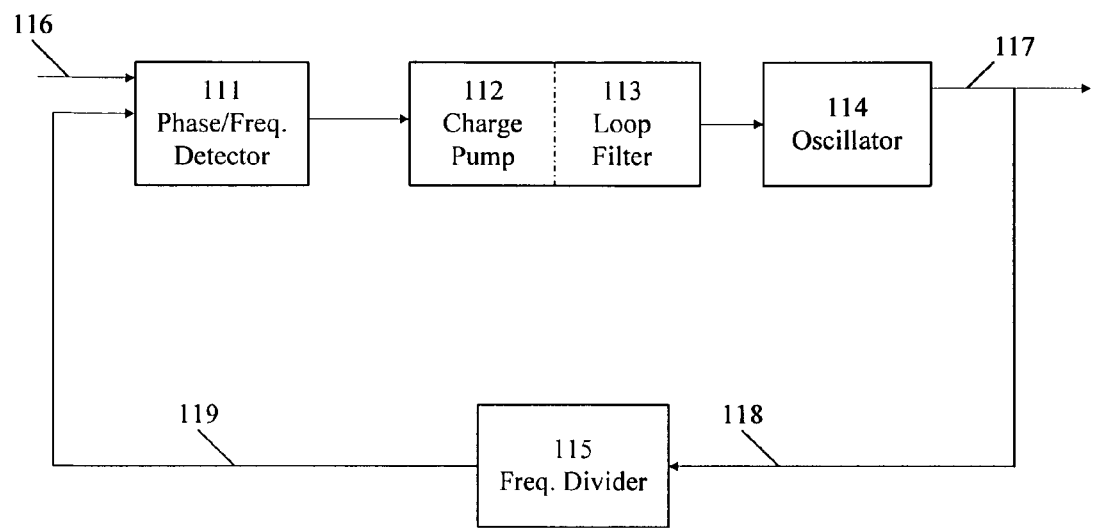
FIGURE 1 : PRIOR ART

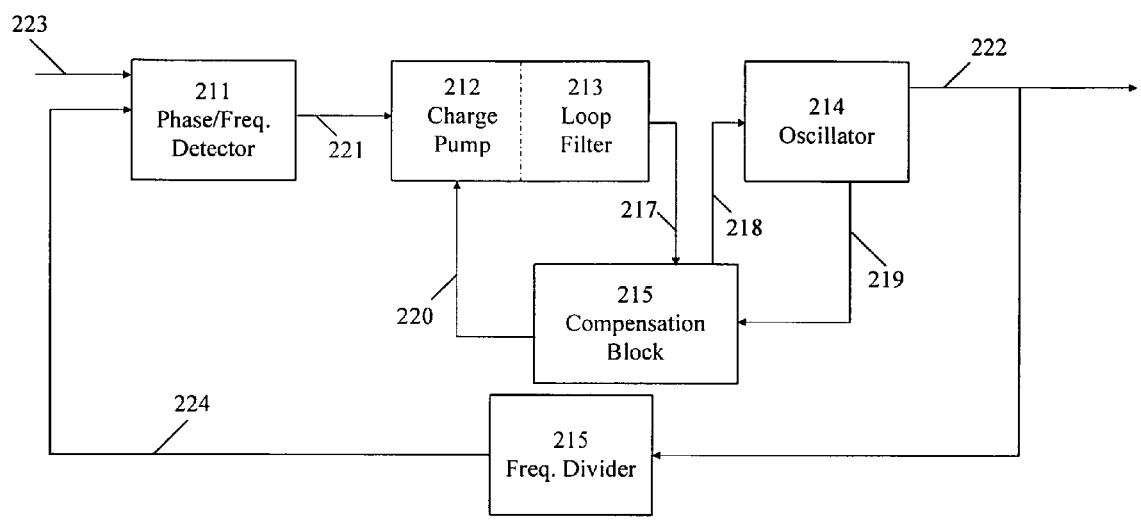
FIGURE 2 : PLL WITH COMPENSATION BLOCK

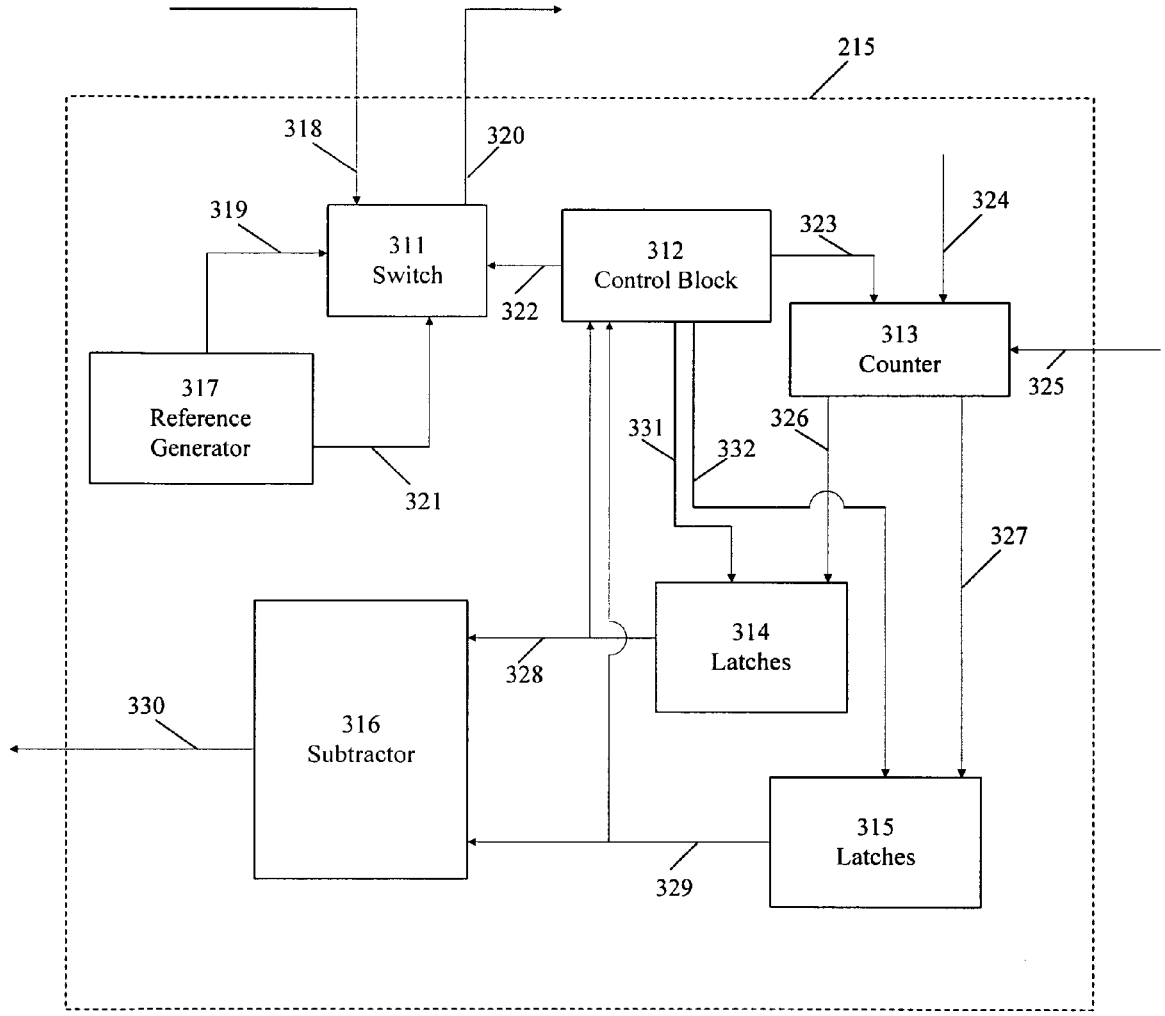
FIGURE 3 : COMPENSATION BLOCK

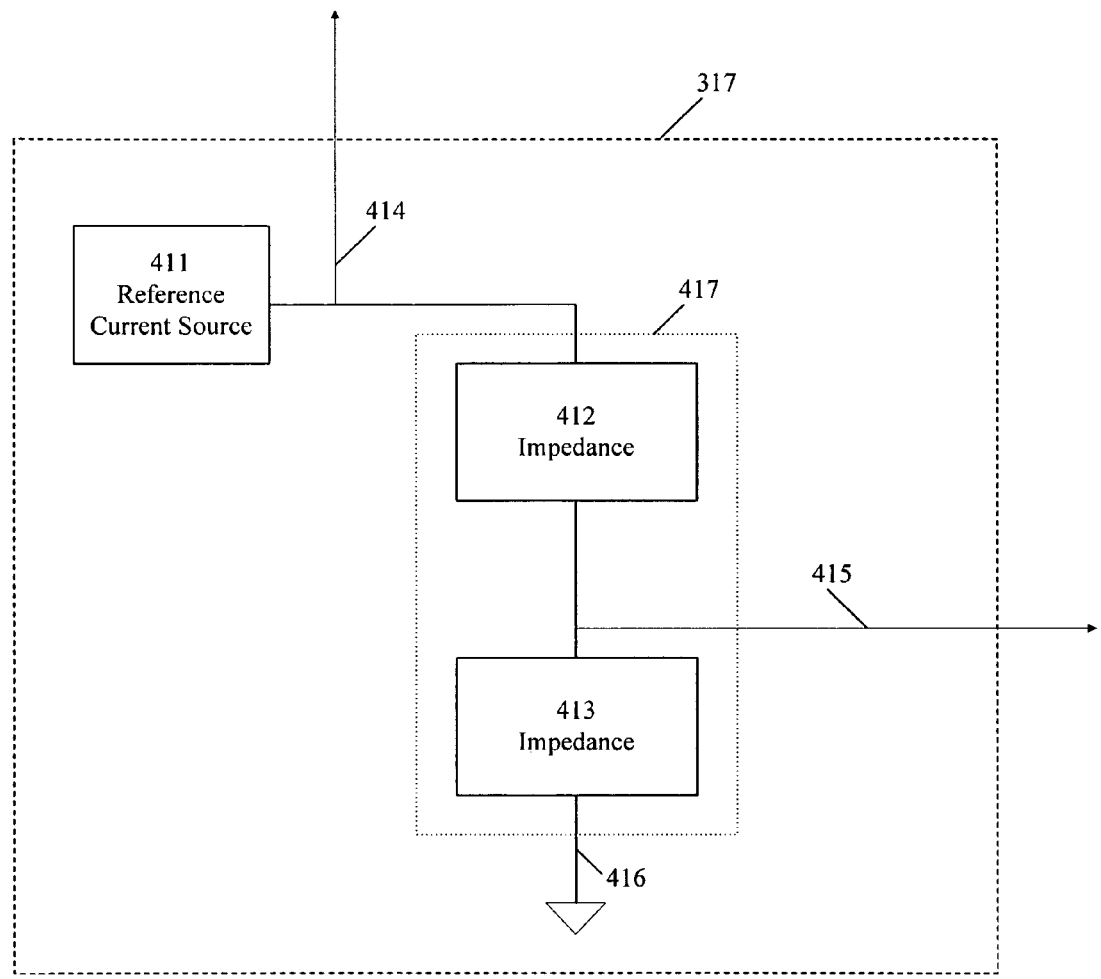
FIGURE 4 : PROGRAMMABLE REFERENCE VOLTAGE GENERATOR

PHASE LOCKED LOOP (PLL) METHOD AND ARCHITECTURE

PRIORITY CLAIM

This application claims priority from Indian patent application No. 3551/Del/2005, filed Dec. 30, 2005, which is incorporated herein by reference.

TECHNICAL FIELD

Embodiments of the present invention relate generally to phase locked loops and more particularly to a method and device of voltage controlled oscillator (VOC) gain compensation to compensate for process and/or temperature variations.

BACKGROUND

A voltage-controlled oscillator (VCO) is an electronic oscillator in which the oscillation frequency is controlled by a voltage input. Voltage controlled oscillators are commonly used in modern communication devices. The variation of the oscillation frequency of the VCO is linear with respect to the input voltage. The change in the output frequency relative to the change in the input control voltage signal (i.e. delta frequency/delta volt) determines the frequency gain of the VCO.

One of the common applications for a VCO is phase locked loop (PLL) circuit. A phase-locked loop is a closed-loop feedback control system that maintains a generated signal in a fixed phase relationship to a reference signal. PLLs are commonly used in demodulation of amplitude modulated signals and angle modulated signals. A PLL circuit generally consists of a phase-frequency detector, a charge pump, a loop filter, a voltage controlled oscillator and an adjustable divider.

The working of a PLL is similar to a feedback system. Here, the phase of the output signal is fed back and the VCO frequency gets adjusted until it is equal to that of the input signal. The phase-frequency detector generates a voltage signal which represents the difference in phase and frequency between two signal inputs. The charge pump uses energy storage elements to convert direct current (DC) voltages into other DC voltages. The loop filter is a low-pass narrow-band filter which is used to remove jitter from the charge pump output. If the VCO needs to operate at a higher frequency, the charge pump drives current into the loop filter. But if the VCO needs to operate at a lower frequency, the charge pump draws current from the loop filter. The loop filter output voltage is given as input to the VCO, according to which the VCO oscillates at a higher or lower frequency. The oscillator output is given as a feedback signal to the adjustable divider which is used to make the PLL's output clock a fractional multiple of the reference frequency at the input of the PLL.

These devices extensively use transistors whose properties vary according to variations in temperature. Transistor operating characteristics get degraded at high temperatures and the frequency gain is relatively low at high temperatures. However at lower temperatures, the VCO frequency gain is relatively high. This large frequency gain variation adversely affects the PLL performance. Transistor properties also vary due to variations in the manufacturing process. These variations in transistor properties lead to performance degradation and unreliable behavior in PLLs.

Prior approaches have been utilized to provide gain compensation for a VCO in PLLs. One such scheme involves making changes in the circuit of the VCO to provide gain compensation. However, this scheme achieves gain compensation only across temperature variations, whereas no compensation is achieved across process variations. Making changes in the circuit of the VCO adversely affects design flexibility and also degrades VCO performance as this VCO design results in more phase noise.

SUMMARY

According to one embodiment of the present invention, a phase locked loop (PLL) includes a phase frequency detector having a first input connected to an input of the PLL. A controlled charge pump with an associated loop filter has its input connected to the output of the phase frequency detector. The PLL includes a controlled oscillator and a frequency divider having its input connected to the output of the controlled oscillator and its output connected to the second input of the phase frequency detector. A compensation block has a first input connected to the output of the controlled charge pump, a second input connected to the output of the controlled oscillator, a first output connected to the control input of the controlled charge pump and a second output connected to the control input of the controlled oscillator.

One method for compensating the effects of temperatures and process variation factors on the gain sensitivity of the controlled oscillator in a Phase Locked Loop (PLL) includes determining the expected minimum and maximum control signal values and corresponding controlled oscillator expected output frequencies across process corners and operating temperature limits using accurate simulations of the controlled oscillator performance. The expected minimum value of the control signal is applied to the control input of the controlled oscillator and the minimum controlled oscillator output frequency obtained is measured. The expected maximum value of the control signal is applied to the control input of the controlled oscillator and the maximum controlled oscillator output frequency obtained is measured. The gain of the charge pump is set to provide the required control signal levels to adjust the measured minimum and maximum controlled oscillator output frequencies to the expected minimum and maximum output frequencies.

Embodiments of the present invention provide, in a PLL or other signal generator, gain compensation for temperature and/or process variations without modifying the signal generator circuit or causing performance degradation.

One embodiment of the present invention provides a PLL in which gain compensation for a voltage controlled oscillator for temperature and/or process variations is achieved by modifying the charge pump current.

Embodiments of the present invention provide gain compensation in a VCO for both temperature and process variations by modifying the charge pump current. The scheme does not involve any changes in the VCO circuit for gain compensation but rather modifies the charge pump current. This is possible in this embodiment because the loop bandwidth and the damping factor of the PLL are proportional to the product of VCO gain and the charge pump current and the intention behind VCO gain compensation is to obtain constant damping factor and loop bandwidth across process and temperature corners.

BRIEF DESCRIPTION OF THE DRAWINGS

An embodiment of the present invention is described with the help of following drawings.

FIG. 1 is a block diagram of a known PLL architecture.

FIG. 2 is a block diagram of a PLL with a compensation block in accordance with one embodiment of the present invention.

FIG. 3 is a block diagram showing in more detail one of the implementations of the compensation block for use in a phase locked loop (PLL) according to one embodiment of the present invention.

FIG. 4 is a block diagram of a programmable reference voltage generator in accordance with one embodiment of the present invention.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

FIG. 1 is a block diagram of a conventional phase locked ioop (PLL) architecture. This comprises a phase-frequency detector (111), a charge pump (112), a loop filter (113), a controlled oscillator (114) and an adjustable divider (115). The phase-frequency detector (111) is a circuit that generates a voltage signal which represents the difference in phase and frequency between two signal inputs (116,119). The charge pump (112) is an electronic circuit that uses energy storage elements to convert direct current (DC) voltages into other DC voltages. The loop filter (113) removes jitters from the charge pump to smoothen the control voltage. The controlled oscillator (114) is an electronic oscillator which is controlled in oscillation frequency by a voltage or current input. The oscillator output is given as a feedback signal (118) to the adjustable divider (115). The adjustable divider (115) is used to make the PLL's output clock (117) a fractional multiple of the reference frequency (116) at the input of the PLL.

FIG. 2 is a block diagram of a PLL with a compensation block in accordance with one embodiment of the present invention. The compensation block (215) is connected between the controlled oscillator (214) and the controlled charge pump (212). The compensation block (215) is used to calculate the charge pump current according to values representing actual performance of the controlled oscillator (214) and the typical performance of the controlled oscillator (214). The calculation is done in a way so that the charge pump current is modified according to the actual gain of the controlled oscillator (214). This is because the loop bandwidth and the damping factor of the PLL are proportional to the product of controlled oscillator gain and the charge pump current. So the arrangement provides controlled oscillator gain compensation by obtaining constant damping factor and loop bandwidth across process and temperature corners by changing the charge pump current according to controlled oscillator gain. Once the charge pump current is decided, it is used during the normal operation of the PLL.

FIG. 3 is a block diagram showing in detail one of the implementations of the compensation block (215) of FIG. 2 according to one embodiment of the present invention for use in a phase locked loop (PLL). The compensation block comprises a switch (311), a digital control block (312), a counter (313), a first set of latches (314), a second set of latches (315), a subtractor (316) and a programmable reference voltage generator (317). Referring to FIG. 4 the programmable reference voltage generator (317) consists of a reference current source (411) and two impedances (412,413) connected in series according to one embodiment of the present invention. Here in this implementation we have taken the controlled oscillator (214) as a voltage controlled oscillator (VCO) although any type of controlled oscillator can be used. Switch (311) receives inputs (318/217, 319, 321) from the programmable reference voltage generator (317) and the charge pump (212) via the loop fitter (213). The switch (311) is used for switching between $V_{CONT1}$ (319), $V_{CONT2}$ (321) and the charge pump output (318/217). The output (320/218) of the switch (311) is connected to the VCO (214).

Control signals required are generated by the digital control block (312). The digital control block (312) receives inputs (328, 329) from the latches (314,315). The switch (311) receives control signals (322) from the digital control block (312). The digital control block (312) also controls the operation of the counter (313) and the latches (314,315). The counter (313) receives inputs from the PLL input clock (324) and the VCO (214). Outputs of the counter (313) are coupled to first and second set of latches (314,315). The outputs (328, 329) of the latches (314, 315) are fed to the subtractor (316) and the digital control block (312). The output (330/220) of the subtractor (316) is fed back to the charge pump (212).

FIG. 4 illustrates an embodiment of the programmable reference voltage generator (317) as used in one embodiment of the present invention. The input signal producer comprises the reference current source (411) and two impedances (412, 413) connected in series. The requirement for the current reference (411) is that it should at least give a first order temperature compensated current.

In operation a simulator is used to find the maximum and minimum control voltages for the voltage controlled oscillator (VCO) frequency range for each combination of the process and temperature corners. Then the maximum and minimum values of the control voltage are selected from these voltages and are termed as $V_{CONT1}$ and $V_{CONT2}$ respectively. After the values of $V_{CONT1}$ and $V_{CONT2}$ are calculated, current from the current reference (411) is passed through two impedances (412,413) in series to generate the voltages $V_{CONT1}$ (414/319) and $V_{CONT2}$ (415/321). The intermediate node between the two impedances (412,413) is tapped for control voltage $V_{CONT2}$ (415/321) and output node of the reference current source is tapped for generating control voltage $V_{CONT1}$ (414/319). The impedance (413) is connected to ground (416). Current in reference current source (411) may be varied to change $V_{CONT1}$ (414/319) and $V_{CONT2}$ (415/321).

When the PLL is powered up, the charge pump output (318/217) is disconnected from the control voltage input (218/320) of the VCO (214) and $V_{CONT1}$ (414/319) from the current reference (411) is connected to the control voltage input (218/320) of the VCO (214). The number of cycles of VCO (214) in some cycles of PLL input clock (324) are counted in binary form and stored in the first set of latches (314). After the bits have been latched, $V_{CONT1}$ (414/319) is disconnected from the control voltage input (218/320) of the VCO (214) and then $V_{CONT2}$ (415/321) is connected to the control voltage input (218/320) of the VCO (214). The number of cycles of VCO output (325/219) in the same number of cycles of PLL input clock (324) used in case of $V_{CONT1}$ (414/319) are again counted in binary form and stored in the second set of latches (315). Using a subtractor circuit (316), the two binary values are subtracted from each other to give another binary value termed $D_{CYCLE}$. Using a simulator, the corresponding binary value is also obtained for the typical process and temperature corner of the voltage controlled oscillator for $V_{CONT1}$ (414/319) and $V_{CONT2}$ (415/321) and is termed $D_{TCYCLE}$.

The charge pump current is modified to change the current delivered to the loop filter (213) according to these bits ($D_{CYCLE}$). If the value of $D_{CYCLE}$ is less than $D_{TCYCLE}$, this would imply that the VCO gain is lesser than the typical gain and hence more current should be delivered to the loop filter (213) to keep the bandwidth same as the bandwidth for typical process and temperature corners. If the value of $D_{CYCLE}$ is larger than $D_{TCYCLE}$, the current delivered by the charge pump to the loop filter is decreased to keep the bandwidth same as the bandwidth for typical process and temperature corners. If the value of $D_{CYCLE}$ is equal to $D_{TCYCLE}$, then the output from the charge pump (212) should be such that the PLL has a bandwidth corresponding to the typical process and temperature corners.

After the charge pump bits (220/330) have been decided, the input control voltage (218/320) of the VCO (214) connects to the charge pump output (217/318) to start the normal operation of the PLL with modified charge pump current.

In this PLL architecture, gain compensation is achieved by modifying the charge pump current. The loop bandwidth and the damping factor of a PLL are proportional to the product of VCO gain and the charge pump current and the intention behind VCO gain compensation is to obtain constant damping factor and loop bandwidth across process and temperature corners.

One advantage of using this PLL architecture is that the VCO gain compensation is achieved for both process and temperature variations. The second advantage is that the goal is achieved without modifying the VCO circuit.

PLLs according to embodiments of the present invention may be used in a variety of different types of integrated circuits, such as microprocessors, and these integrated circuits may, in turn, be contained in a variety of different types of electronic systems, such as computer systems.

The present invention is not intended to be restricted to any particular form or arrangement, or any specific embodiment, or any specific use, disclosed herein, since the same may be modified in various particulars or relations without departing from the spirit or scope of the claimed invention hereinabove shown and described of which the apparatus or method shown is intended only for illustration and disclosure of an operative embodiment and not to show all of the various forms or modifications in which this invention might be embodied or operated.

We claim:

1. A phase locked loop (PLL), comprising:
   a phase frequency detector having a first input connected to the input of the PLL and having a second input,
   controlled charge pump with an associated loop filter, having its input connected to the output of the phase frequency detector, and having a control input, an output, and having a gain,
   a controlled oscillator having a control input an output,
   a frequency divider having its input connected to the output of the controlled oscillator and its output connected to the second input of said phase frequency detector, and
   a compensation block having a first input connected to the output of said controlled charge pump, a second input connected to the output of said controlled oscillator, a first output connected to the control input of said controlled charge pump and a second output connected to the control input of said controlled oscillator, the compensation block operable to generated signals on the first and seconds outputs to set the value of the gain of the controlled charge pump that causes the controlled charge pump to supply control signals on the control input of the controlled oscillator that causes an output signal on the output of the controlled oscillator to have minimum and maximum frequencies having expected minimum and maximum values, respectively.

2. A phased locked loop (PLL) as claimed in claim 1, wherein said compensation block comprises:
   a three-way selection switch having its output connected to the second output of said compensation block,
   a programmable reference voltage generator having a first reference voltage connected to a first input of said three-way selection switch and a second reference voltage connected to a second input of said three-way selection switch,
   a third input of said three-way selection switch connected to the first input of said compensation block,
   the selection input of said three-way selection switch being connected to a first output of a digital control block,
   a gated counter having a first gating input connected to the input clock of the PLL, and a second gating input connected to a second output of said digital control block and its count input connected to said second input of the compensation block,
   a first set of latches connected to the output of said gated counter for storing the count output when said first reference voltage is enabled by said three-way selection switch, said first set of latches being latch enabled by a third output of said digital control block.
   a second set of latches connected to the output of said gated counter for storing the count output when said second reference voltage is enabled by said three-way selection switch, said second set of latches being latch enabled by a fourth output of said digital control block, and
   a subtractor receiving the output of the first set of latches at its first input, the output of said second set of latches at its second input, and having its output connected to the second output of said compensation block.

3. A phased locked loop (PLL) as claimed in claim 2 wherein said programmable reference voltage generator comprising:
   a digitally controlled reference voltage generator providing said first reference voltage having its value defined by the output of computer simulation models covering the simulated combined effects of process variation limit conditions and operating temperature variation limit conditions, and
   a voltage divider deriving said second reference voltage from the first reference voltage level.

4. A method for compensating the effects of temperatures and process variation factors on the gain sensitivity of the controlled oscillator in a Phase Locked Loop (PLL), comprising the steps of:
   determining the expected minimum and maximum control signal values and corresponding controlled oscillator expected output frequencies across process corners and operating temperature limits using accurate simulations of controlled oscillator performance,
   applying the expected minimum value of control signal to the control input of the controlled oscillator and measuring the minimum controlled oscillator output frequency obtained,
   applying the expected maximum value of the control signal to the control input of the controlled oscillator and measuring the maximum controlled oscillator output frequency obtained,
   setting the gain of the charge pump to provide the required control signal levels to adjust said measured minimum and maximum controlled oscillator output frequencies to the expected minimum and maximum output frequencies.

5. A method for compensating the effects of temperatures and process variation factors on the gain sensitivity of the controlled oscillator in a Phase Locked Loop (PLL) as claimed in claim 4, wherein the controlled oscillator output frequency is measured by the steps of:
  enabling a counter connected to the output of the controlled oscillator during one state of the PLL input clock, and storing the count value in a set of latches at the transition of the PLL clock.

6. A phase locked loop, comprising:
  a phase detector having a first input adapted to receive a input clock signal and having a second input that receives a feedback signal, the phase detector operable to develop a phase error signal indicating a difference in phase between the input clock signal and the feedback signal;
  a controllable charge pump connected to the phase detector to receive the phase error signal and having a control input that receives a cycle gain value, the controllable charge pump operable to develop a pump voltage responsive to the phase error signal and cycle gain value;
  a controllable oscillator having an input that receives a control signal and having an output, the controllable oscillator operable to develop a phase locked output signal on the output responsive to the control signal;
  a frequency divider having an input coupled to the output of the controlled oscillator to receive the phase locked output signal and having an output coupled to the second input of the phase detector, the frequency divider operable apply the feedback signal to the phase detector responsive to the phase locked output signal; and
  a compensation circuit having a first input coupled to the charge pump to receive the pump voltage, a second input coupled to the output of the controllable oscillator to receive the phase locked output signal, a third input adapted to receive the input clock signal, a first output coupled to the control input of the controllable charge pump, and a second output coupled to the input of the controllable oscillator, the compensation circuit operable to generate a first control voltage corresponding to a desired maximum frequency of the phase locked output signal and to generate a second control voltage corresponding to a desired minimum frequency of the phase locked output signal, and the compensation circuit operable to output one of the first control voltage, second control voltage, and pump voltage as the input to the controllable oscillator, and the compensation circuit further operable to develop the cycle gain value from the input clock signal and the phase locked output signal and to provide the cycle gain value on the first output to the controllable charge pump.

7. The phase locked loop of claim 6 wherein the controllable oscillator comprises a voltage controlled oscillator.

8. The phase locked loop of claim 6 wherein the controllable charge pump includes a loop filter.

9. The phase locked loop of claim 6 wherein the compensation circuit includes a programmable reference voltage generator for developing the first and second control voltages.

10. The phase locked loop of claim 9 wherein the programmable reference generator includes a current source coupled in series with two impedances.

11. The phase locked loop of claim 6 wherein the compensation circuit develops the cycle gain value by generating a first count corresponding to the number of cycles of the phase locked output signal that occur during a given number of cycles of the input clock signal when the compensation circuit provides the first control voltage to the controllable oscillator, and by generating a second count corresponding to the number of cycles of the phase locked output signal that occur during a given number of cycles of the input clock signal when the compensation circuit provides the second control voltage to the controllable oscillator, and taking the difference between the first and second counts to generate the cycle gain value.

12. The phase locked loop of claim 11 wherein the compensation circuit is further operable to develop a typical cycle gain value and to utilize this typical gain value in determining the cycle gain value provided to the charge pump.

13. The phase locked loop of claim 12 wherein the compensation circuit is further operable to provide the pump voltage to the input of the controllable oscillator once the cycle gain value has been determined.

14. An integrated circuit, comprising:
  electronic circuitry including a phase locked loop, the phase locked loop including,
    a phase detector having a first input adapted to receive a input clock signal and having a second input that receives a feedback signal, the phase detector operable to develop a phase error signal indicating a difference in phase between the input clock signal and the feedback signal;
    a controllable charge pump connected to the phase detector to receive the phase error signal and having a control input that receives a cycle gain value, the controllable charge pump operable to develop a pump voltage responsive to the phase error signal and cycle gain value;
    a controllable oscillator having an input that receives a control signal and having an output, the controllable oscillator operable to develop a phase locked output signal on the output responsive to the control signal;
  a frequency divider having an input coupled to the output of the controlled oscillator to receive the phase locked output signal and having an output coupled to the second input of the phase detector, the frequency divider operable apply the feedback signal to the phase detector responsive to the phase locked output signal; and
    a compensation circuit having a first input coupled to the charge pump to receive the pump voltage, a second input coupled to the output of the controllable oscillator to receive the phase locked output signal, a third input adapted to receive the input clock signal, a first output coupled to the control input of the controllable charge pump, and a second output coupled to the input of the controllable oscillator, the compensation circuit operable to generate a first control voltage corresponding to a desired maximum frequency of the phase locked output signal and to generate a second control voltage corresponding to a desired minimum frequency of the phase locked output signal, and the compensation circuit operable to output one of the first control voltage, second control voltage, and pump voltage as the input to the controllable oscillator, and the compensation circuit further operable to develop the cycle gain value from the input clock signal and the phase locked output signal and to provide the cycle gain value on the first output to the controllable charge pump.

15. The integrated circuit of claim 14 wherein the electronic circuitry comprises microprocessor circuitry.

16. An electronic system, comprising:
  electronic components, the electronic components including at least one integrated circuit, each integrated circuit including,
    electronic circuitry including a phase locked loop, the phase locked loop including, a phase detector having a first input adapted to receive a input clock signal and having a second input that receives a feedback signal, the phase detector operable to develop a phase error signal indicating a difference in phase between the input clock signal and the feedback signal;

a controllable charge pump connected to the phase detector to receive the phase error signal and having a control input that receives a cycle gain value, the controllable charge pump operable to develop a pump voltage responsive to the phase error signal and cycle gain value;

a controllable oscillator having an input that receives a control signal and having an output, the controllable oscillator operable to develop a phase locked output signal on the output responsive to the control signal;

a frequency divider having an input coupled to the output of the controlled oscillator to receive the phase locked output signal and having an output coupled to the second input of the phase detector, the frequency divider operable apply the feedback signal to the phase detector responsive to the phase locked output signal; and a compensation circuit having a first input coupled to the charge pump to receive the pump voltage, a second input coupled to the output of the controllable oscillator to receive the phase locked output signal, a third input adapted to receive the input clock signal, a first output coupled to the control input of the controllable charge pump, and a second output coupled to the input of the controllable oscillator, the compensation circuit operable to generate a first control voltage corresponding to a desired maximum frequency of the phase locked output signal and to generate a second control voltage corresponding to a desired minimum frequency of the phase locked output signal, and the compensation circuit operable to output one of the first control voltage, second control voltage, and pump voltage as the input to the controllable oscillator, and the compensation circuit further operable to develop the cycle gain value from the input clock signal and the phase locked output signal and to provide the cycle gain value on the first output to the controllable charge pump.

17. The electronic system of claim 16 wherein the electronic components comprise a computer system.

18. A method for compensating for the effects of temperature and process variations on a controllable oscillator in a phase locked loop, the phase locked loop including a charge pump that develops a control voltage applied to the controllable oscillator, the method comprising:

determining a first control voltage corresponding to value of a control voltage applied to the controlled oscillator to achieve a maximum desired frequency for a signal output from the controlled oscillator;

determining a second control voltage corresponding to value of the control voltage applied to the controlled oscillator to achieve a minimum desired frequency for the signal output from the controlled oscillator;

applying the first control voltage to the controllable oscillator and detecting the frequency of the output from the controlled oscillator;

applying the second control voltage to the controllable oscillator and detecting the frequency of the output from the controlled oscillator;

from these measured values for the frequency of the output from the controlled oscillator, determining a gain value for the charge pump so the charge pump supplies control voltages to the controllable oscillator so the output has the desired minimum and maximum frequencies.

19. The method of claim 18 wherein detecting the frequency of the output from the controlled oscillator comprises developing a count value indicating the number of cycles of the output over a predetermined time.

20. The method of claim 19 further comprising taking a difference between the count value when the first control voltage is applied to the controllable oscillator and the count value when the second control voltage is applied to the controllable oscillator, this difference being used in determining the gain value.

* * * * *

UNITED STATES PATENT AND TRADEMARK OFFICE
CERTIFICATE OF CORRECTION

PATENT NO.        : 7,663,415 B2                                                Page 1 of 2
APPLICATION NO.   : 11/649747
DATED             : February 16, 2010
INVENTOR(S)       : Kallol Chatterjee and Nitin Agarwal It is certified that error appears in the above-identified patent and that said Letters Patent is hereby corrected as shown below:

- On the Title Pg. Item (73), please change the text of the assignee's name from "STMicroelectronics PVT. Ltd." to -- STMicroelectronics Pvt. Ltd. --.

- In Claim 1, Column 5, Line 46 of the patent, please insert the text -- a -- before the text "controlled charge pump".

- In Claim 1, Column 5, Line 50 of the patent, please insert the text -- and -- before the text "an output".

- In Claim 1, Column 5, Line 60 of the patent, please change the text "generated" to -- generate --.

- In Claim 1, Column 5, Line 61 of the patent, please change the text "and seconds outputs" to -- and second outputs --.

- In Claim 2, Column 6, Line 23 of the patent, please change the text "digital control block" to -- digital control block, --.

- In Claim 3, Column 6, Line 35 of the patent, please change the text "comprising" to -- comprises --.

- In Claim 4, Column 6, Line 60 of the patent, please insert the text -- and -- after the text "obtained,".

- In Claim 6, Column 7, Line 9 of the patent, please change the text "receive a" to -- receive an --.

- In Claim 6, Column 7, Line 28 of the patent, please insert the text -- to -- before the text "apply".

- In Claim 14, Column 8, Line 17 of the patent, please change the text "receive a" to -- receive an --.

- In Claim 14, Column 8, Line 37 of the patent, please insert the text -- to -- before the text "apply".

- In Claim 16, Column 9, Line 2 of the patent, please change the text "a input clock" to -- an input clock --.

Signed and Sealed this

Twenty-fifth Day of May, 2010

David J. Kappos
*Director of the United States Patent and Trademark Office*

- In Claim 16, Column 9, Line 22 of the patent, please insert the text -- to -- before the text "apply".

- In Claim 18, Column 10, Line 25 of the patent, please insert the text -- and -- after the text "oscillator;".